United States Patent
Furukawa et al.

(10) Patent No.: US 7,800,120 B2
(45) Date of Patent: Sep. 21, 2010

(54) SEMICONDUCTOR LIGHT EMITTING ELEMENT

(75) Inventors: Chisato Furukawa, Fukuoka-ken (JP);
Takafumi Nakamura, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 270 days.

(21) Appl. No.: 11/961,068

(22) Filed: Dec. 20, 2007

(65) Prior Publication Data
US 2008/0164457 A1 Jul. 10, 2008

(30) Foreign Application Priority Data
Dec. 20, 2006 (JP) .............................. 2006-342559

(51) Int. Cl.
*H01L 33/08* (2010.01)
(52) U.S. Cl. .................. 257/97; 257/98; 257/E33.008
(58) Field of Classification Search .................. 257/13, 257/79–103, 918, E51.018–E51.022, E33.001–E33.077, 257/E33.054, E25.028, E25.032
See application file for complete search history.

(56) References Cited

U.S. PATENT DOCUMENTS

| | | | |
|---|---|---|---|
| 6,720,730 | B2 | 4/2004 | Salam |
| 2002/0008323 | A1* | 1/2002 | Watanabe et al. ............ 257/758 |
| 2004/0051107 | A1* | 3/2004 | Nagahama et al. ............ 257/79 |
| 2004/0206961 | A1* | 10/2004 | Yamada et al. ................ 257/79 |
| 2005/0224821 | A1* | 10/2005 | Sakano et al. ................. 257/79 |

FOREIGN PATENT DOCUMENTS

JP 2002-217450 8/2002

OTHER PUBLICATIONS

Machine tranlation of JP 2002217450 A.*

* cited by examiner

*Primary Examiner*—Fernando L Toledo
*Assistant Examiner*—Mamadou Diallo
(74) *Attorney, Agent, or Firm*—Turocy & Watson, LLP

(57) ABSTRACT

A semiconductor light emitting element comprising:
a plurality of light-emitting-layer forming portions each of which includes a pn junction capable of emitting light of a certain wavelength, and which are separated from one another with a translucent resin formed on the side portions of the light-emitting-layer forming portions;
a metal film disposed on first surfaces of the light-emitting-layer forming portions;
a conductive substrate bonded to the metal film;
a lower electrode formed on a surface of the conductive substrate, the surface being opposite to the surface to which the metal film is bonded;
a transparent electrode which is connected to second surfaces, opposite to the first surfaces, of the light-emitting-layer forming portions, and which is substantially transparent to the certain wavelength; and
an upper electrode formed above the second surfaces of the light-emitting-layer forming portions with the transparent electrode sandwiched in between.

20 Claims, 7 Drawing Sheets

SEMICONDUCTOR LIGHT EMITTING ELEMENT

CROSS-REFERENCE TO RELATED APPLICATION

This application is based upon and claims the benefit of priority from the prior Japanese Patent Application No. 2006-342559, filed on Dec. 20, 2006, the entire contents of which are incorporated herein by reference.

BACKGROUND OF THE INVENTION

1. Field of the Invention

The present invention relates to a semiconductor light emitting element.

2. Description of the Related Art

In recent years, a semiconductor light emitting element using an InGaAlP-based material and emitting light in a visible region has been widely applied. Here, the composition of each of an active layer, an n-type cladding layer, and a p-type cladding layer is expressed by $In_{1-Y}(Ga_{1-X}Al_X)_YP$. When the value Y is set at approximately 0.51, the InGaAlP-based material is lattice-matched to a GaAs substrate. At this time, setting the value X as appropriate makes it possible to obtain light emission from the red to green band.

For the purpose of suppressing the absorption of light at an n-side contact electrode portion, a semiconductor light emitting device as follows has been proposed (for example, Japanese Patent Application Laid-open Publication No. 2002-217450). Specifically, after a light-emitting-layer forming portion (semiconductor light emission functional layer) is epitaxially grown on a GaAs substrate, the GaAs substrate is removed. When an n-side electrode is disposed, the n-side electrode is divided into a region with a high reflectance and a region for forming an ohmic contact. Then, these regions are arranged alternately with a repetitive pattern. On the other hand, a p-side electrode is formed in a single circle arranged at the center portion on a current diffusion layer.

However, in this disclosed semiconductor light emitting device, since the p-side electrode is arranged in the center portion on the current diffusion layer, it is difficult to cause the light-emitting-layer forming portion to fully emit light at the peripheral portion thereof. Accordingly, this device has a problem that the light output is insufficient.

BRIEF SUMMARY OF THE INVENTION

According to an aspect of the present invention, there is provided a semiconductor light emitting element comprising:

a plurality of light-emitting-layer forming portions each of which includes a pn junction capable of emitting light of a certain wavelength, and which are separated from one another with a translucent resin formed on the side portions of the light-emitting-layer forming portions;

a metal film disposed on first surfaces of the light-emitting-layer forming portions;

a conductive substrate bonded to the metal film;

a lower electrode formed on a surface of the conductive substrate, the surface being opposite to the surface to which the metal film is bonded;

a transparent electrode which is connected to second surfaces, opposite to the first surfaces, of the light-emitting-layer forming portions, and which is substantially transparent to the certain wavelength; and an upper electrode formed above the second surfaces of the light-emitting-layer forming portions with the transparent electrode sandwiched in between.

According to another aspect of the present invention, there is provided a semiconductor light emitting device comprising:

a lower electrode;

a conductive substrate provided on the lower electrode;

a metal film provided on the conductive substrate;

a plurality of light-emitting-layer forming portions provided on the metal film, and insulated from one another;

an insulating film covering side surfaces of each plurality of light-emitting-layer forming portion, and including an opening on the upper surface of each of the plurality of light-emitting-layer forming portions;

a transparent electrode provided on the insulating film, and being connected to the plurality of light-emitting-layer forming portions via the respective openings; and an upper electrode provided selectively on the transparent electrode so as to connect portions above and corresponding to the respective openings to one another, and joining portions to one another on the portions, the portions corresponding respectively to the openings.

BRIEF DESCRIPTION OF THE DRAWINGS

FIG. 1A is a plan view, while FIG. 1B is a cross-sectional view taken along the line A-A in FIG. 1A.

FIG. 6A is a plan view, while FIG. 6B is a cross-sectional view taken along the line B-B in FIG. 6A.

FIG. 7A is a cross-sectional view of the semiconductor light emitting element, while FIG. 7B is a cross-sectional view of a layer structure including a light-emitting-layer forming portion shown in FIG. 7A.

DETAILED DESCRIPTION OF THE INVENTION

Figure 1A:
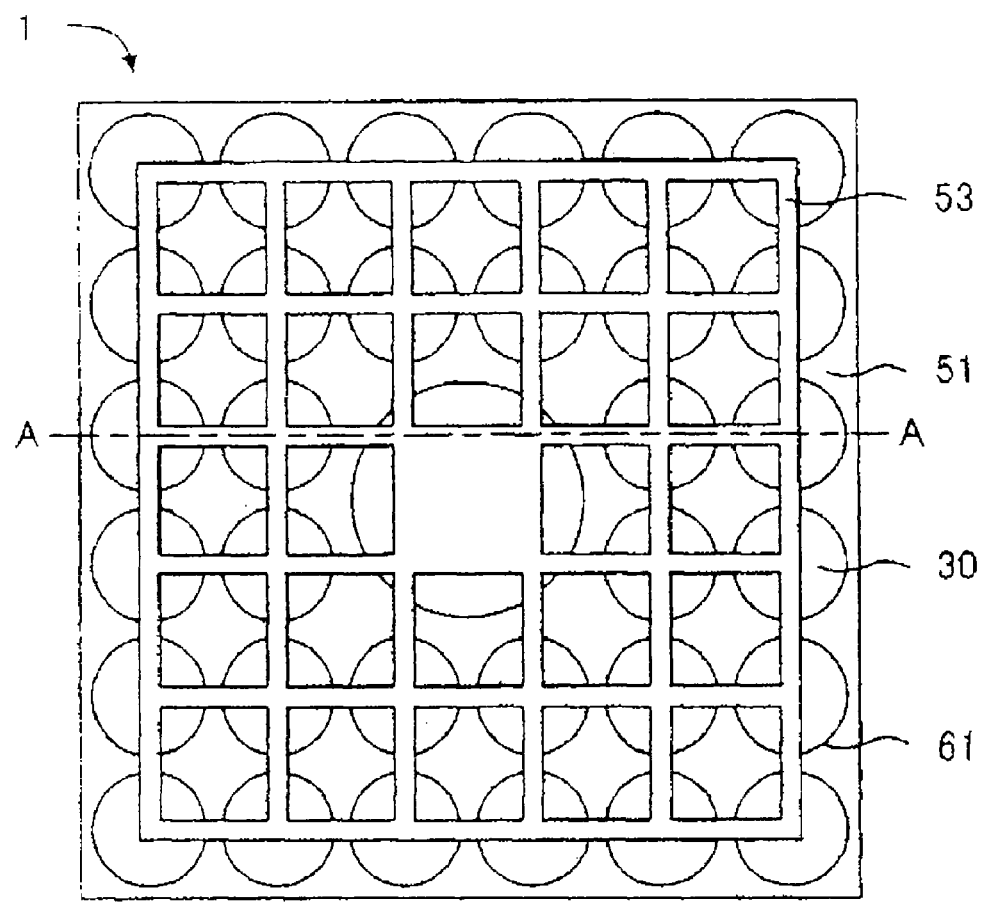
FIGS. 1A and 1B schematically show the structure of a semiconductor light emitting element according to Embodiment 1 of the present invention.

Hereinafter, descriptions will be given of an embodiment of the present invention with reference to the drawings. In the drawings described below, the same reference numerals are given to the same constituent elements.

Embodiment 1

Figure 1B:
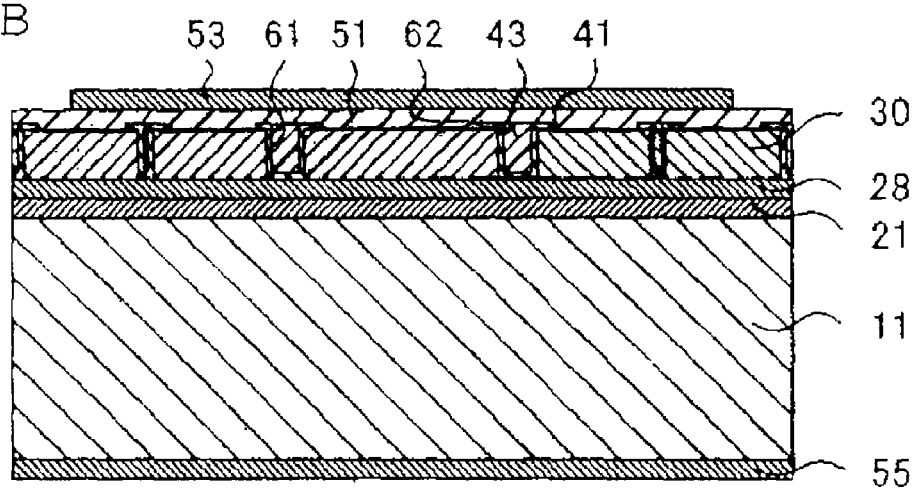

Descriptions will be given of a semiconductor light emitting element according to Embodiment 1 of the present invention, and also of a method of fabricating the same, with reference to FIGS. 1A, 1B, 2A to 2D, 3A to 3D, 4A to 4D, and 5. FIGS. 1A and 1B schematically show the structure of the semiconductor light emitting element. FIG. 1A is a plan view, and FIG. 1B is a cross-sectional view taken along the line A-A in FIG. 1A. FIGS. 2A to 2D are cross-sectional views of the layer structure, and schematically show the method of fabricating the semiconductor light emitting element in order of processes. FIGS. 3A to 3D are cross-sectional views of the layer structure, and schematically show the method of fabricating the semiconductor light emitting element in order of processes, following the processes shown in FIGS. 2A to 2D. FIGS. 4A to 4D are cross-sectional views of the layer structure, and schematically show the method of fabricating the semiconductor light emitting element in order of processes, following the processes shown in FIGS. 3A to 3D. FIG. 5 is a cross-sectional view schematically showing the structure of a semiconductor light emitting device on which the semiconductor light emitting element is mounted.

As shown in FIGS. 1A and 1B, a semiconductor light emitting element 1 includes a conductive substrate 11, a metal film 21, a metal film 28, a plurality of light-emitting-layer forming portions 30, a transparent electrode 51, an upper electrode 53, and a lower electrode 55. The metal film 21 is formed on the conductive substrate 11. The metal film 28 is bonded to the metal film 21. The plurality of light-emitting-layer forming portions 30 are formed on the metal film 28, and separated from one another with a translucent insulating film 41 and a translucent resin film 43. The upper electrode 53 is connected to the light-emitting-layer forming portions 30 via the transparent electrode 51 on the upper portions of the light-emitting-layer forming portions 30. The lower electrode 55 is formed on the lower portion of the conductive substrate 11. Light emitted from the light-emitting-layer forming portions 30 is extracted upward, to the sides and the like, except the direction to the metal film 28.

The conductive substrate 11 is a silicon (Si) substrate having a low resistance. The conductive substrate 11 functions as an electrode and an interconnection, on one side, of the light-emitting-layer forming portions 30, as well as a supporting member for the light-emitting-layer forming portions 30. For this reason, the Si substrate having an impurity introduced thereinto at a high concentration is suitable for the conductive substrate 11. However, another substrate having a low resistance can be also used, for example: semiconductor substrates made of germanium (Ge), GaAs, GaP, and InP; or substrates made of metals such as copper (Cu), aluminum (Al) and molybdenum (Mo).

The metal film 21 is a film having gold (Au) as its main component. The metal film 21 is in ohmic contact with the conductive substrate 11. The interface between the conductive substrate 11 and the metal film 21 may have, for example, a film structure constituted of $MoSi_2$/Mo/Au, PtSi/Ti/Pt/Au, or the like, including an adhesion layer and a barrier metal layer. The lower electrode 55 is a film having gold (Au) as its main component, with a structure similar to that of the metal film 21.

Each of the light-emitting-layer forming portions 30 has a layer structure in which a p-type cladding layer, a MQW (Multi Quantum Well) active layer having 30 well layers stacked therein, and an n-type cladding layer are stacked from the metal film 28 side. In the interface between the p-type cladding layer and the metal film 28, formed are a portion made of Au having zinc (Zn) added thereto for forming the ohmic contact, and a portion made of only Au for maintaining the mirror surface. Although the metal film 28 and the metal film 21 are bonded to each other at the interface therebetween by a solid phase reaction, the interface is often obscure. The metal film 28 and the metal film 21 may be bonded to each other by forming an AuGe eutectic alloy (with the concentration of Ge of 12 wt %) between the metal film 28 and the metal film 21.

As shown in FIG. 1A, each of the light-emitting layer forming portions 30 has a columnar shape standing substantially perpendicular to the lamination plane. The columnar light-emitting-layer forming portions 30 are arranged in a checkerboard pattern around one of the light-emitting-layer forming portions 30 having a relatively large diameter with respect to the other light-emitting-layer forming portions 30, and being arranged at the center portion in the plane. The larger light-emitting-layer forming portion 30 arranged at the center has a diameter that enables a wire-bonding pad to be disposed in a corresponding area on the upper electrode 53. The diameter of the larger light-emitting-layer forming portion 30 is, for example, approximately 120 µm. Each column of the surrounding light-emitting-layer forming portions 30 may have an appropriate diameter in consideration of the amount of light emitted with respect to an injected current, or in consideration of the light-extraction efficiency of the emitted light. Each column of the surrounding light-emitting-layer forming portions 30 has, for example, a diameter of approximately 60 µm. The diameter of 60 µm is several tens of times larger than the thickness of each light-emitting-layer forming portion 30, which will be described later. The diameter of each of the surrounding columnar light-emitting-layer forming portion 30 may be set smaller. Note that, the surrounding columnar light-emitting-layer forming portions 30 are arranged in the checkerboard pattern, that is, in a two-dimensional array in which line segments each connecting the centers of two adjacent columns intersect at approximately 90 degrees. However, for the purpose of enhancing the area efficiency, the surrounding columnar light-emitting-layer forming portions 30 may be arranged in a two-dimensional array in which line segments each connecting the centers of two adjacent columns intersect at approximately 60 degrees. Alternatively, each light-emitting-layer forming portion 30 may be formed in a triangular prism, a rectangular prism, a hexagonal prism, or an octagonal prism, instead of the columnar shape.

The side portion and the upper portion of each columnar light-emitting-layer forming portion 30 are partly covered with the insulating film 41 made of, for example, a silicon nitride film. The insulating film 41 is formed, so as to serve as an antireflection film, to have a thickness of $m \cdot \lambda/(4n_r)$ (m is a positive odd number) where $\lambda$ represents the light emission wavelength of the light-emitting-layer forming portions 30, and $n_r$ represents the refractive index of the insulating film 41.

A groove 61 on the outer side of a part, surrounding each light-emitting-layer forming portion 30, of the insulating films 41 is filled with the resin film 43. In other words, the surfaces forming the groove 61 face the resin film 43. The resin film 43 is formed to have the upper surface thereof positioned at the same height as that of the surface of the insulating film 41 on the upper portion of each column. The resin film 43 is, for example, a polyimide resin, which is transparent and insulating, and which has a relatively small refractive index. Alternatively, it is also possible to use, for the resin film 43, an epoxy resin, a silicone resin or the like, that is transparent and insulating, and that has a small refraction index relative to that of the insulating film 41.

An opening 62 is formed in a vicinity of the center of the circle on the upper surface of the column of each light-emitting-layer forming portion 30. The transparent electrode 51 is formed to be in direct contact with each light-emitting-layer forming portion 30 through the opening 62. As the transparent electrode 51, for example, an ITO (Indium Tin Oxide) film is employed. Alternatively, an IO (Indium Oxide) film, a TO (Tin Oxide) film, or for example, a thin metal film having a thickness of not more than 20 nm, may be employed. Note that, it is preferable that the ITO film or the like contain a metal, such as Au, Cu, silver (Ag), palladium (Pd), tantalum (Ta), cobalt (Co), rhodium (Rh), nickel (Ni), platinum (Pt). As the thin metal film, for example, Au, Ag, Pd, Ta, Cu, Co, Rh, Ni, Pt, or the like may be employed.

The upper electrode 53 includes a rectangular portion positioned within the circle of the column of the larger light-emitting-layer forming portion 30 at the center of the plane for the purpose of allowing a wire to be bonded to the upper electrode 53. The upper electrode 53 is also connected, in the surrounding area of the plane, to the transparent electrode 51 above the opening 62 on each columnar light-emitting-layer forming portion 30. In addition, the upper electrode 53 includes, in the surrounding area of the plane, thin metal wiring arranged in a manner of connecting the positions of the respective openings 62, and connected to the rectangular portion at the center of the plane. The upper electrode 53 has a cross-sectional area enough to allow a current necessary for the light emission to be flown therethrough, and is made of, for example, Au, Al, or Cu.

Figure 2A:
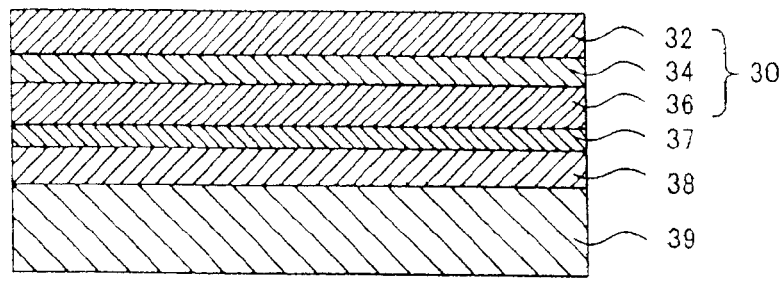
FIGS. 2A to 2D are cross-sectional views of the layer structure, and schematically show, in order of processes, a method of fabricating the semiconductor light emitting element according to Embodiment 1 of the present invention.

Next, processes for fabricating the semiconductor light emitting element 1, and the constituent elements thereof will be described in detail. As shown in FIG. 2A, epitaxially-grown layers are formed by using, for example, a known MOCVD (Metal Organic Chemical Vapor Deposition) system. An n-type GaAs substrate 39 doped with Si is firstly prepared. On the surface of the n-type GaAs substrate 39, a buffer layer 38 made of n-type GaAs with a thickness of approximately 0.5 μm is epitaxially grown. On the surface of the buffer layer 38, an etching stop layer 37 made of n-type InAlP with a thickness of approximately 0.05 μm is epitaxially grown. On the surface of the etching stop layer 37, an n-type cladding layer 36 made of n-type InGaAlP with a thickness of approximately 0.6 μm is epitaxially grown. On the surface of the n-type cladding layer 36, an active layer 34 made of InGaAlP with a thickness of approximately 0.4 μm is epitaxially grown. On the surface of the active layer 34, a p-type cladding layer 32 made of p-type InGaAlP with a thickness of approximately 0.6 μm is epitaxially grown. Here, the epitaxial layers involved in the light emission, that is, the layers from the p-type cladding layer 32 to the n-type cladding layer 36 are correctively called the light-emitting-layer forming portion 30. Note that, a cover layer made of InAlP with a thickness of approximately 0.15 μm may be epitaxially grown on the surface of the p-type cladding layer 32 for the purpose of protecting the surface layer.

The active layer 34 has a MQW structure in which, for example, 30 well layers each made of $In_{0.5}Ga_{0.48}Al_{0.02}P$ with a thickness of approximately 8 nm, and 31 barrier layers each made of $In_{0.5}Ga_{0.2}Al_{0.3}P$ with a thickness of approximately 5 nm are stacked.

In addition, it is possible to substitute, for example, a ternary layer for each of the n-type cladding layer 36 and the p-type cladding layer 32. Moreover, it is possible to form a current diffusion layer on a side, far from the active layer 34, of the n-type cladding layer 36, or of the p-type cladding layer 32. Furthermore, it is also possible to form, for example, a contact layer for reducing the contact resistance with the metal of the electrodes.

Figure 2B:
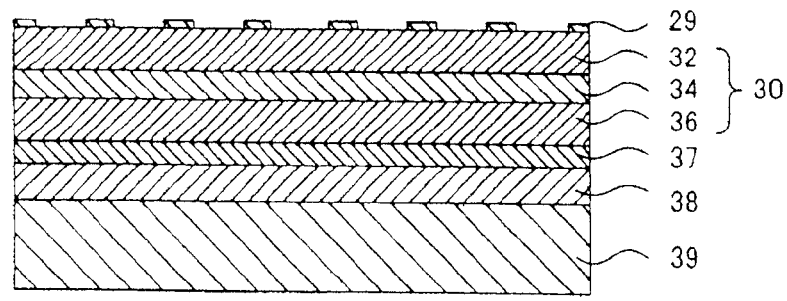

As shown in FIG. 2B, an ohmic contact forming layer 29 made of AuZn is formed in a pattern including a land shape, a linear shape, and a frame shape in combination, on the surface of the p-type cladding layer 32. The ohmic contact forming layer 29 is formed in the following manner, for example. Firstly, the material for the ohmic contact forming layer 29 is deposited by using a vapor deposition apparatus. Then, the deposition is etched with iodine-potassium iodide solution by using, as a mask, a resist patterned by a photolithographic method, so that the ohmic contact forming layer 29 is formed. Note that, the ohmic contact forming layer 29 may be formed also by a lift-off method. Specifically, a layer including part which will become the ohmic contact forming layer 29 is deposited on a resist which has been patterned in advance. Then, the resist is stripped, so that the ohmic contact forming layer 29 is formed. The ohmic contact forming layer 29 is formed to be in contact with the circular bottom surface side (the side opposite to that where light is extracted) of each light-emitting-layer forming portion 30, which will be formed in a columnar shape in the end. In addition, the ohmic contact forming layer 29 is preferably formed so that the density of the ohmic contact forming layer 29 will be relatively high in a vicinity of the circle of each light-emitting-layer forming portion 30. It should be noted that the area of the ohmic contact forming layer 29 may be 10% to 40% of the total area of the circles, on the bottom surface side, of the respective light-emitting-layer forming portions 30.

Figure 2C:
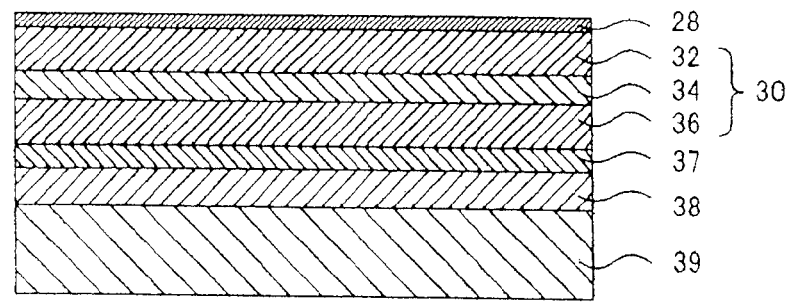

As shown in FIG. 2C, the n-type GaAs substrate 39 with the ohmic contact forming layer 29 thus patterned is thermally treated, so that the ohmic contact forming layer 29 is brought into ohmic contact with the p-type cladding layer 32. Thereafter, a metal layer 28 made of, for example, Au is deposited on the surface of the p-type cladding layer 32. Note that, since the ohmic contact forming layer 29 may be considered to be substantially integral with the metal layer 28, the ohmic contact forming layer 29 will be illustrated below as part of the metal layer 28. The metal layer 28 may be made of Al, Ag, or the like, instead of Au.

Figure 2D:
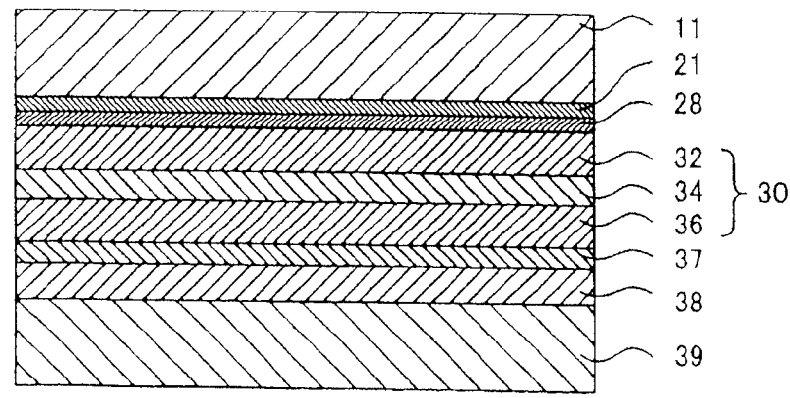

As shown in FIG. 2D, the metal layer 28 on the layers for the light-emitting-layer forming portions 30 is connected, by thermocompression, to a metal layer 21 that is formed on a surface of a conductive substrate 11. The conductive substrate 11 is, for example, a p-type Si substrate into which an impurity is introduced at a high concentration. The metal layer 21 is formed on the conductive substrate 11. In the metal layer 21, $MoSi_2$ as an adhesion layer, Mo as a barrier metal, and Au are sequentially deposited from the bottom. The metal layer 28 and the metal layer 21 may be bonded to each other by applying, in addition to heat and pressure, ultrasonic waves.

Figure 3A:
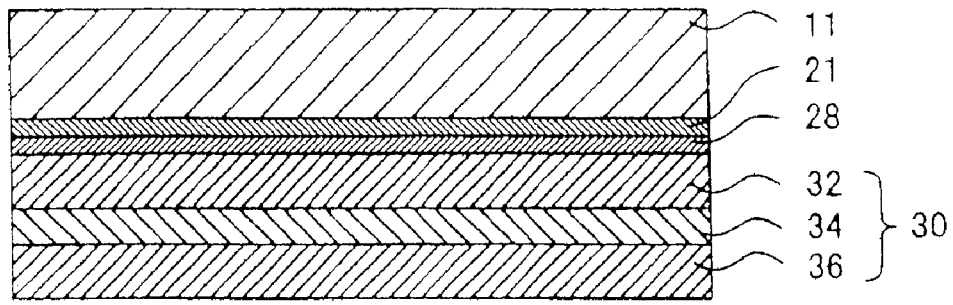
FIGS. 3A to 3D are cross-sectional views of the layer structure, and schematically show, in order of processes, the method of fabricating the semiconductor light emitting element according to Embodiment 1 of the present invention.

As shown in FIG. 3A, the n-type GaAs substrate 39 and the buffer layer 38 on the n-type GaAs substrate 39 side which is integrally bonded to the conductive substrate 11 are etched away using a mixed solution of ammonia and aqueous hydrogen peroxide. Note that, the n-type GaAs substrate 39 may be etched away after the n-type GaAs substrate 39 is grinded or polished to be made thinner. After that, the etching stop layer 37 is etched away using, for example, phosphoric acid at the temperature of 70° C., so that the n-type cladding layer 36 is exposed to the outside.

Figure 3B:
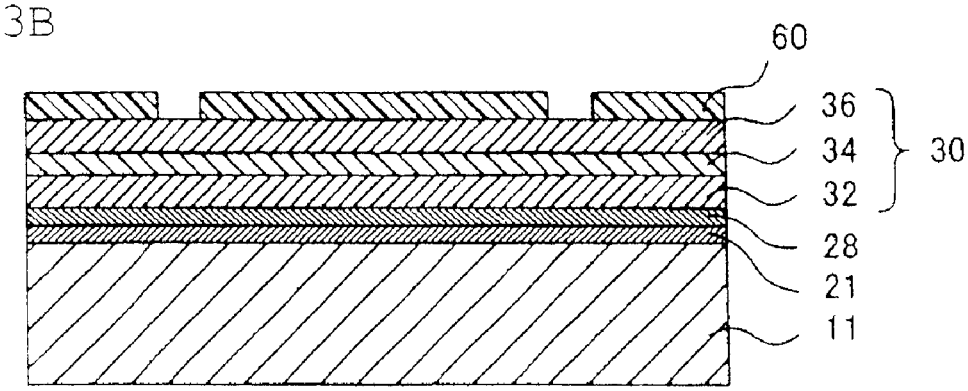

As shown in FIG. 3B, the whole layers are turned over, so that the n-type cladding layer 36 faces upward. Then, a resist 60 patterned by a photolithographic method is formed on the n-type cladding layer 36. In order to form the semiconductor light emitting element 1 shown in FIG. 1, the resist 60 is patterned so that a light emitting element forming portion 30 positioned at the center will have a large diameter while the other light emitting element forming portions 30 positioned in the surrounding area will have a small diameter each.

Figure 3C:
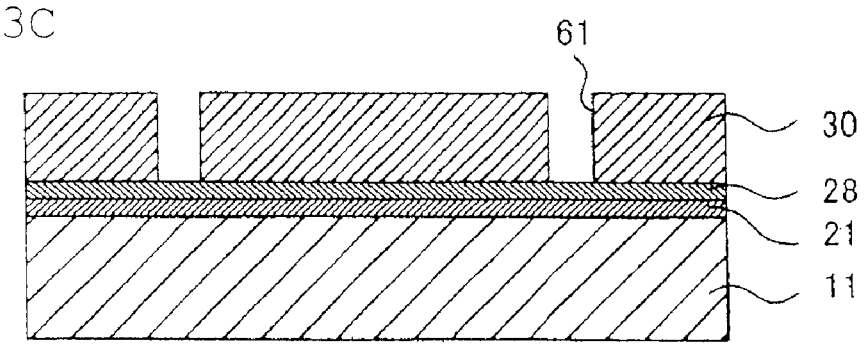

As shown in FIG. 3C, the layers for the light-emitting-layer forming portions 30 is etched by using the resist 60 as a mask, so that the groove 61 is formed. The etching for the light-emitting-layer forming portions 30 is performed by a RIE (Reactive Ion Etching) method, perpendicularly to the surface of the layer for the light-emitting-layer forming portions 30, until the etched surface reaches the metal layer 28. The groove 61 may be formed alternatively by, for example, an ion milling method or an anisotropic wet etching. The side surfaces which form the groove 61 may be, not perpendicular, but slightly inclined in a tapered manner rather than perpendicular, with respect to the surface of the light-emitting-layer forming portion 30. The groove 61 needs to have a bottom lower than the interface between the n-type cladding layer 36 and the active layer 34. In FIG. 3C and the subsequent cross-sectional views showing the fabrication processes, the light-emitting-layer forming portions 30 will be shown without the specific configuration thereof.

Figure 3D:
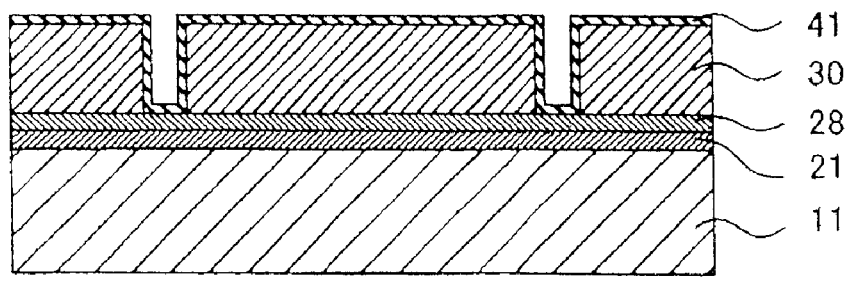

As shown in FIG. 3D, the insulating film 41 made of a silicon oxide film is formed on the surfaces of the light-emitting-layer forming portions 30 by a thermal or plasma CVD (Chemical Vapor Deposition) method. The insulating film 41 is formed, so as to serve as an antireflection film, to have a thickness of $m \cdot \lambda/(4n_r)$ ($n_r$ is the refractive index, and m is a positive odd number) where $\lambda$ represents the light emission wavelength of the light-emitting-layer forming portions 30. For example, when the refractive index $n_r$ of the silicon oxide film is 1.45, and the light emission wavelength $\lambda$ is 600 nm for red color, the thickness of the insulating film 41 is an odd-fold of 103 nm.

Figure 4A:
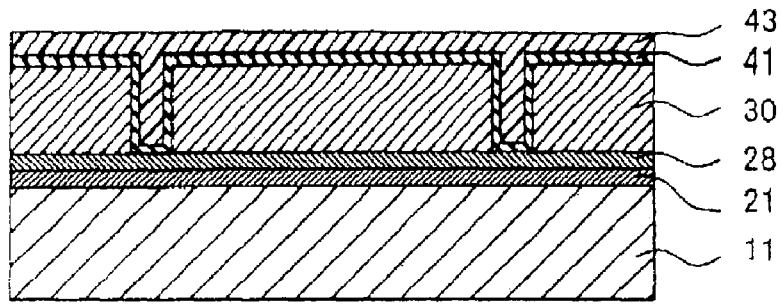
FIGS. 4A to 4D are cross-sectional views of the layer structure, and schematically show, in order of processes, the method of fabricating the semiconductor light emitting element according to Embodiment 1 of the present invention.
Figure 5:
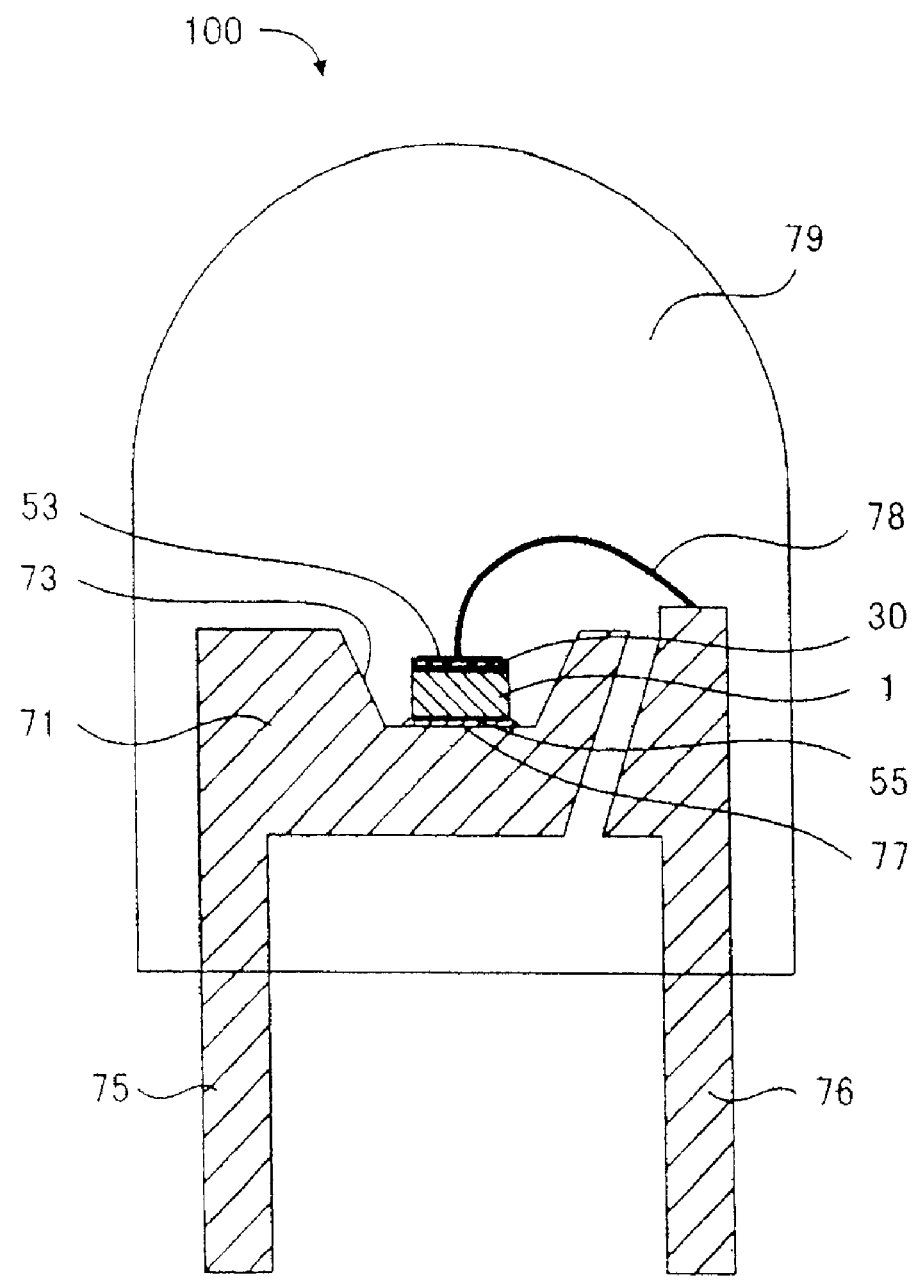
FIG. 5 is a cross-sectional view showing the structure of a semiconductor light emitting device on which the semiconductor light emitting element according to Embodiment 1 of the present invention is mounted.

As shown in FIG. 4A, the resin film 43 made of a translucent polyimide resin is formed on the surface of the insulating film 41 in a manner of filling the groove 61 by, for example, a spin coating method, and is then solidified. Note that, the resin film 43 may be made alternatively of an epoxy resin or a silicone resin.

Figure 4B:
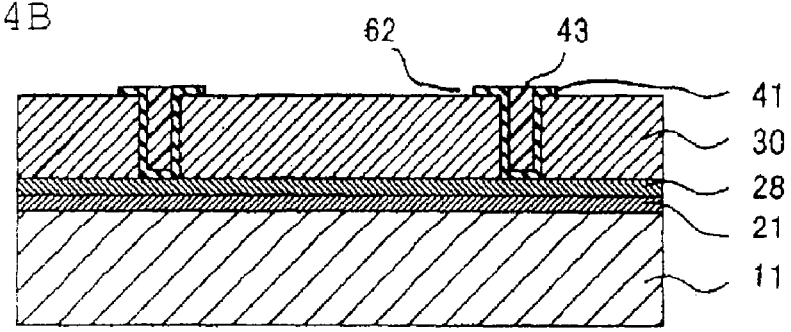

As shown in FIG. 4B, the surface of the resin film 43 is etched back by a CDE (Chemical Dry Etching) method so as to have the same height as that of the surface of the insulating film 41. Thereafter, the surface of the insulating film 41 is patterned by a photolithographic method, and is then etched, so that, for example, the circular openings 62 are formed for establishing an electrical connection to the light-emitting-layer forming portions 30. The etch back process may be performed in combination with a CMP (Chemical Mechanical Polishing) method.

Figure 4C:
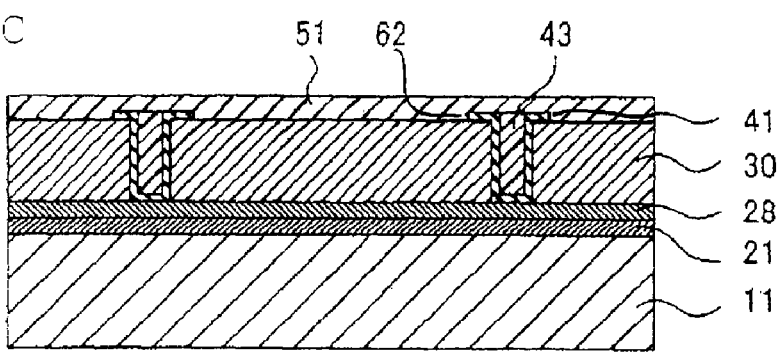

As shown in FIG. 4C, an ohmic contact is firstly formed by a lift-off method in the following manner: for example, AnGe is firstly deposited on the surfaces of the light-emitting-layer forming portions 30 in the openings 62; and a heat treatment is then performed thereon. Thereafter, the transparent electrode 51 made of ITO is formed, in the opening 62, as well as on the surfaces of the insulating film 41 and the resin film 43, by a sputtering method or a CVD method.

Figure 4D:
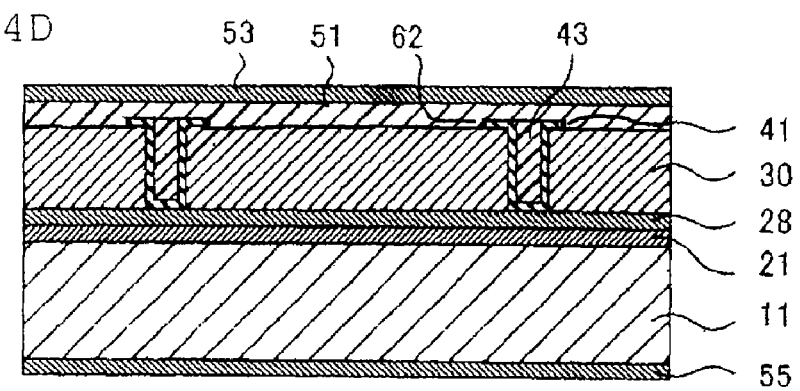

As shown in FIG. 4D, the upper electrode 53 including Au as its main component is formed, for example, by means of a deposition method. The upper electrode 53 is formed in a thin linear shape being connected to the opened surfaces of the light-emitting-layer forming portions 30 via the transparent electrode 51, and also connecting the upper portions of the openings 62 to one another. The upper electrode 53 may be made thinner in the same manner as that of forming the ohmic contact forming layer 29 on the p-type cladding layer 32.

Specifically, the upper electrode 53 may be made thinner by an etching method using iodine-potassium iodide solution, or by a lift-off method. Then, the lower electrode 55 similar to the metal layer 21 is formed on the bottom surface of the conductive substrate 11, that is, the surface on the opposite side to the upper electrode 53, of the conductive substrate 11. Here, the lower electrode 55 may be formed entirely, or in portions except the dicing lines (not illustrated), on the bottom surface. Thereafter, the light-emitting-layer forming portions 30 supported on the conductive substrate 11 are cut into individual pieces by a dicing machine (not illustrated). Consequently, as shown in FIG. 1, the semiconductor light emitting element 1 is completed.

As shown in FIG. 5, the semiconductor light emitting element 1 fabricated in the above-described processes is mounted on, for example, a header 71, so as to be incorporated into a semiconductor light emitting device 100. The lower electrode 55 in the bottom surface of the semiconductor light emitting element 1 is mounted on the bottom portion of a concave cup portion 73 of the header 71 with a conductive adhesive agent 77 made of, for example, Ag paste. The upper electrode 53 of the semiconductor light emitting element 1 is connected to an end portion of a lead 76 with, for example, an Au wire 78. The inclined surface of the cup portion 73 forms a reflecting surface, in a manner that the opening diameter of the cup portion 73 is increased in a direction in which light is extracted. A lead 75 is connected to the header 71. The semiconductor light emitting element 1, the Au wire 78, the header 71, and part of the leads 75 and 76 are sealed in a bullet-like shape with a sealing resin 79 made of, for example, an epoxy resin, so as to be the semiconductor light emitting device 100.

When the semiconductor light emitting element 1 mounted on the semiconductor light emitting device 100 is energized from the upper electrode 53 and the lower electrode 55 via the leads 75 and 76, light is emitted from the light-emitting-layer forming portions 30. Part of the light is extracted directly from the upper surface, on the upper electrode 53 side, of the device 100 while the other part of the light is extracted from the side surface of the device 100 after being reflected from the inclined surface of the cup portion 73.

As described above, in the semiconductor light emitting element 1, the light-emitting-layer forming portions 30 are separated from one another to have a columnar shape each. In addition, the insulating film 41 serving as the antireflection film is formed on the upper and side surfaces of each light-emitting-layer forming portion 30. Moreover, the bottom surface of each light-emitting-layer forming portion 30 is in contact with the metal film 28 having a high reflectance, and being different from an ohmic contact. The space on the side surfaces of the respective light-emitting-layer forming portions 30 is filled with the translucent resin film 43. The upper surface of each light-emitting-layer forming portion 30 is connected to the transparent electrode 51 via the corresponding opening 62 formed in the insulating film 41, and is further connected to the upper electrode 53 on the transparent electrode 51. The bottom surface of each light-emitting-layer forming portion 30 is connected to the lower electrode 55 via the metal film 28, the conductive substrate 11, and the like. In other words, the plurality of separated light-emitting-layer forming portions 30 are connected in parallel between the upper electrode 53 and the lower electrode 55.

As a result, in the semiconductor light emitting element 1, the light-emitting-layer forming portions 30 in the surrounding area are also allowed to be supplied with current so as to emit light. Part of the light thus emitted is extracted directly from the upper and side surfaces of each light-emitting-layer forming portion 30 via the antireflection film to the outside of the light-emitting-layer forming portion 30. The other part of the light thus emitted travels in the direction to the bottom surface, is then reflected from the metal film 28, and is eventually extracted from the upper and side surfaces of the light-emitting-layer forming portion 30 in the same manner as above. The light thus extracted passes through the resin film 43 and the transparent electrode 51 so as to be extracted to the outside of the semiconductor light emitting element 1. The light thus extracted to the outside of the semiconductor light emitting element 1 is further extracted through the transparent sealing resin 79 to the outside of the semiconductor light emitting device 100 so as to be usable light.

In the semiconductor light emitting element 1, since the metal film for reflection is formed in the bottom surface, the light-emitting-layer forming portions 30 in the surrounding area can effectively emit light, in comparison to a semiconductor light emitting element with a single non-separated light-emitting-layer forming portion. Accordingly, it is possible to increase the light output. Moreover, in the semiconductor light emitting element 1, the light-emitting-layer forming portions 30 are separated, while the resin film 43 for antireflection and the transparent electrode 51 are used. Accordingly, it is possible to more effectively extract light.

The semiconductor light emitting element 1 has a structure in which a wire is bonded to one portion of the upper electrode 53 even though the light-emitting-layer forming portions 30 are separated. Accordingly, the process for incorporating the semiconductor light emitting element 1 into the semiconductor light emitting device 100 is not complicated.

Embodiment 2

Figure 6A:
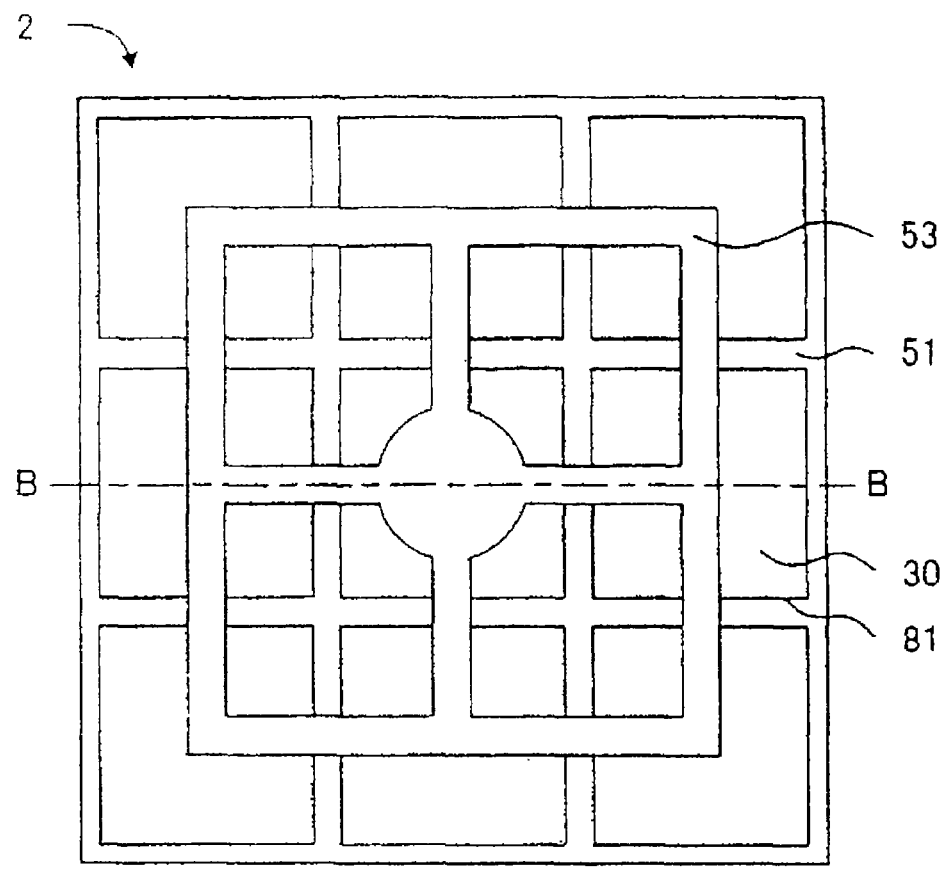
FIGS. 6A and 6B schematically show the structure of a semiconductor light emitting element according to Embodiment 2 of the present invention.
Figure 6B:
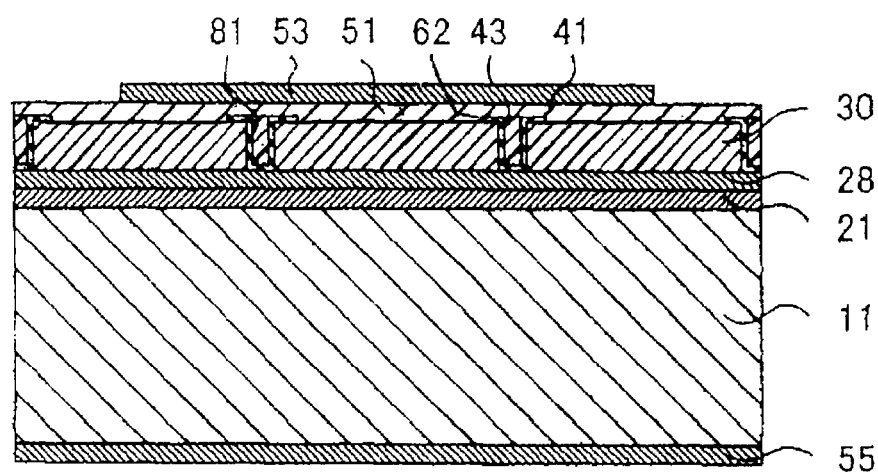

Descriptions will be given of a semiconductor light emitting element according to Embodiment 2 of the present invention, and also of a method of fabricating the same, with reference to FIGS. 6A and 6B. FIGS. 6A and 6B schematically show the structure of the semiconductor light emitting element. FIG. 6A is a plan view, and FIG. 6B is a cross-sectional view taken along the line B-B in FIG. 6A. Embodiment 2 is different from Embodiment 1 in that the shape of each of light-emitting-layer forming portions separated from one another with a groove having a constant width is a rectangular prism. Hereinafter, the same constituent parts as those of Embodiment 1 are denoted by the same reference numerals. Then, descriptions will be given of the different constituent parts while omitting descriptions of the same parts.

As shown in FIGS. 6A and 6B, a semiconductor light emitting element 2 is different from the semiconductor light emitting element 1 of Embodiment 1 in the following point. Specifically, the shape of each of a plurality of light-emitting-layer forming portions 30 separated from one another with a groove having a substantially constant width, is rectangular in a plane, and a rectangular prism in the three-dimensions. Most of the other parts of the semiconductor light emitting element 2 have the same structures as those of the semiconductor light emitting element 1 of Embodiment 1.

As shown in FIG. 6A, each of light-emitting-layer forming portions 30 has a rectangular prism having substantially the same size, and standing perpendicular to the lamination plane. The light-emitting-layer forming portions 30 are arranged in a checkerboard pattern. Each side of one of the light-emitting-layer forming portions 30 that is arranged at the center portion in the plane has a length that enables a wire-bonding pad to be disposed in the corresponding area on the upper electrode 53. The length of the side is, for example, approximately 120 µm. The groove 81 separating the light-emitting-layer forming portions 30 is a linear shape with the constant width, and is arranged in a grid pattern.

An opening 62 is provided in a vicinity of the center of the rectangle on the upper surface of the rectangular prism of each light-emitting-layer forming portion 30. A transparent electrode 51 is formed to be in direct contact with each light-emitting-layer forming portion 30 through the opening 62. The upper electrode 53 includes a large circular portion for wire bonding on the rectangular prism of the light-emitting-layer forming portion 30 arranged at the center portion of the plane. The upper electrode 53 is also connected, in the surrounding area of the plane, to the transparent electrode 51 above the opening 62 on the rectangular prism of each light-emitting-layer forming portion 30. In addition, the upper electrode 53 includes, in the surrounding area of the plane, metal thin wiring arranged in a manner of connecting the positions of the respective openings 62, and connected to the circular portion at the center of the plane.

Processes for fabricating the semiconductor light emitting element 2 are carried out in the same manner as those for fabricating the semiconductor light emitting element 1 of Embodiment 1. The groove 81 is formed to extend from the surfaces of the light-emitting-layer forming portions to the metal film 28 by half-cut dicing using a dicing machine (not illustrated). It is also possible to form the groove 81 by a RIE method or the like as in the case of Embodiment 1.

In the semiconductor light emitting element 2, the light-emitting-layer forming portions 30 are formed by half-cut dicing. Accordingly, the groove 81 is formed in a linear shape, and the shape of each light-emitting-layer forming portion 30 is formed in the above-described rectangular prism, a triangular prism, or the like. The semiconductor light emitting element 2 also provides the same effects as those of the semiconductor light emitting element 1 of Embodiment 1.

Embodiment 3

Figure 7A:
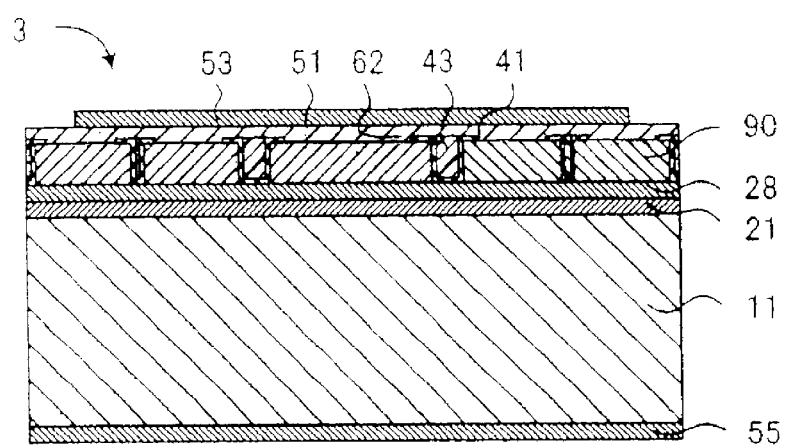
FIGS. 7A and 7B schematically show the structure of a semiconductor light emitting element according to Embodiment 3 of the present invention.
Figure 7B:
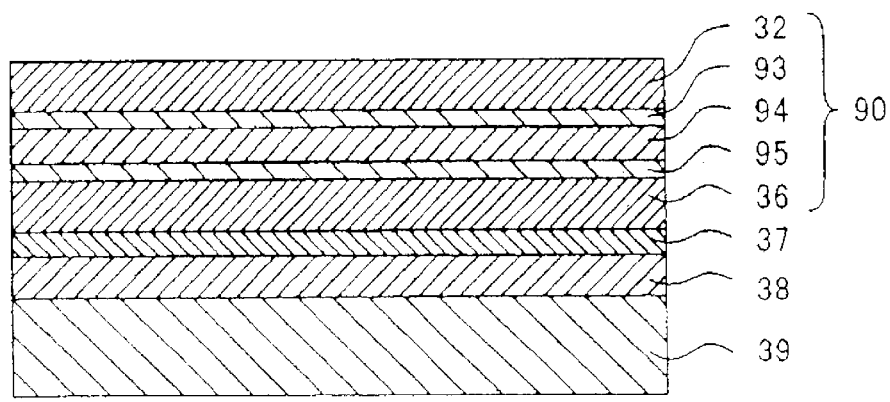

Descriptions will be given of a semiconductor light emitting element according to Embodiment 3 of the present invention, and also of a method of fabricating the same, with reference to FIGS. 7A and 7B. FIGS. 7A and 7B schematically show the structure of a semiconductor light emitting element. FIG. 7A is a cross-sectional view of the semiconductor light emitting element. FIG. 7B is a cross-sectional view of a layer structure including a light-emitting-layer forming portion shown in FIG. 7A. The lamination structure of the light-emitting-layer forming portion is different from that in Embodiment 1. Hereinafter, the same constituent parts as those of Embodiment 1 are denoted with the same reference numerals. Then, descriptions will be given of the different constituent parts while omitting descriptions of the same parts.

As shown in FIG. 7A, a semiconductor light emitting element 3 includes light-emitting-layer forming portions 90 different from those in the aforementioned embodiments. As shown in FIG. 7B, each of the light-emitting-layer forming portions 90 is configured as follows for the purpose of achieving high-speed starting and stopping of light emission. Specifically, each of the light-emitting-layer forming portions 90 additionally includes n-type and p-type light-guiding layers 95 and 93, while a MQW active layer 94 includes 10 well layers. Each of the light-emitting-layer forming portions 90 includes, in order of growth: an n-type cladding layer 36 made of n-type InGaAlP with a thickness of approximately 0.6 µm; the n-type light-guiding layer 95 made of InGaAlP with a thickness of approximately 0.5 µm on the n-type cladding layer 36; the active layer 94 made of InGaAlP with a thickness of approximately 0.13 μm on the n-type light-guiding layer 95; the p-type light-guiding layer 93 made of InGaAlP with a thickness of approximately 0-5 μm on the surface of the active layer 94; and a p-type cladding layer 32 made of p-type InGaAlP with a thickness of approximately 0.6 μm on the p-type light-guiding layer 93. Note that, it is also possible that only one of the n-type and p-type light-guiding layers 95 and 93 is provided to each light-emitting-layer forming portion 90.

The semiconductor light emitting element 3 may be fabricated by epitaxial growth while the light-emitting-layer forming portions 90 are substituted for the light-emitting-layer forming portions 30 of Embodiment 1.

As a result, in the semiconductor light emitting element 3, the number of well layers/barrier layers in the active layer 94 with the MQW structure in each light-emitting-layer forming portion 90 is reduced, so that the light confinement effect is enhanced. Accordingly, the rising time (tr) taken for the steady-state value of the light output to rise from 10% to 90%, and also the falling time (tf) taken for the steady-state value of the light output to fall from 90% to 10%, are improved by approximately 30% in comparison to the semiconductor light emitting element 1 of Embodiment 1. As a result, the semiconductor light emitting element 3 obtains a performance satisfying, for example, tr=tf≦1 ns. Since the number of well layers/barrier layers in each active layer 94 is reduced in the semiconductor light emitting element 3, the light-emission efficiency of each light-emitting-layer forming portion 90 becomes lower than each light-emitting-layer forming portion 30 of Embodiment 1. As a result, the amount of light extracted from the semiconductor light emitting element 1 is approximately the same as that of the semiconductor light emitting element with a single non-separated light-emitting-layer forming portion, which has been referred to as the comparative example for Embodiment 1. This means that the semiconductor light emitting element 3 has the amount of extracted light equivalent to that of the conventional semiconductor light emitting element, and also has a capability for a fast response. The semiconductor light emitting element 3 can thus be used for, for example, currently-demanded visible light communications (VLC) with a speed of not less than 50 Mbps.

In other words, the semiconductor light emitting element 3 has a structure capable of improving the light output, the increase in light output can be used for achieving the fast response. For this reason, the semiconductor light emitting element 3 can contribute to the speeding up of the visible light communications, for example.

As described above, present embodiments provides a semiconductor light emitting element in which light-emitting-layer forming portions in the surrounding area can effectively emit light.

In addition, according to the present embodiments, it is possible to provide a semiconductor light emitting element in which light-emitting-layer forming portions in the surrounding area can effectively emit light.

The present invention is not limited to the above-described embodiments, and thus can be implemented with various modifications made thereon without departing from the scope of the present invention.

For example, in the examples illustrated for describing the above-described embodiments, the light-emitting-layer forming portions are formed by epitaxial growth on the n-type GaAs substrate. However, a p-type GaAs substrate can be used instead of the n-type GaAs substrate. In the configuration of this case, the conductivity type is reversed. In this case, since it is necessary, for example, to form an ohmic contact with an n-type cladding layer in a light-emitting-layer forming portion, Au having Ge added thereto is used for an ohmic contact forming layer.

In addition, in the examples shown for describing the above-described embodiments, the semiconductor light emitting device is fabricated in the structure called a bullet type (or a radial type). However, it is also possible to fabricate a surface mount semiconductor light emitting device with the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor light emitting element comprising:
   a plurality of light-emitting-layer forming portions each of which includes a pn junction capable of emitting light of a certain wavelength, and which are separated from one another with a translucent resin formed on the side portions of the light-emitting-layer forming portions;
   a metal film disposed on first surfaces of the light-emitting-layer forming portions;
   a conductive substrate bonded to the metal film;
   a lower electrode formed on a surface of the conductive substrate, the surface being opposite to the surface to which the metal film is bonded;
   a transparent electrode which is connected to second surfaces, opposite to the first surfaces, of the light-emitting-layer forming portions, and which is substantially transparent to the certain wavelength; and
   an upper electrode formed above the second surfaces of the light-emitting-layer forming portions with the transparent electrode sandwiched in between,
   wherein the transparent resin is provided between the lower electrode and the upper electrode.

2. The semiconductor light emitting element according to claim 1 further comprising an insulating film having a thickness of $m \cdot \lambda/(4n_r)$ (m is a positive odd number) where $\lambda$ represents the certain wavelength, and $n_r$ represents the refractive index of the insulating film,
   wherein each light-emitting-layer forming portion is, on the second surface thereof and a surface thereof facing the translucent resin, in contact with the insulating film.

3. The semiconductor light emitting element according to claim 1 further comprising, in each light-emitting-layer forming portion, a light-guiding layer inserted into at least one of the interface between an n-type cladding layer and an active layer, and the interface between the active layer and a p-type cladding layer,
   wherein the light-guiding layer has a refractive index equivalent to a mean value of the refractive indices of the respective layers in contact with the light-guiding layer on the two sides thereof.

4. The semiconductor light emitting element according to claim 1 wherein, as to each light-emitting-layer forming portion, the surface facing the translucent resin is perpendicular to, and otherwise is slightly inclined rather than perpendicular to, the second surface.

5. The semiconductor light emitting element according to claim 3 wherein the active layer has a MQW structure including not more than 10 well layers.

6. A semiconductor light emitting device comprising:
   a lower electrode;

a conductive substrate provided on the lower electrode;
a metal film provided on the conductive substrate;
a plurality of light-emitting-layer forming portions provided on the metal film, and insulated from one another;
an insulating film covering side surfaces of each plurality of light-emitting-layer forming portion, and including an opening on the upper surface of each of the plurality of light-emitting-layer forming portions;
a transparent electrode provided on the insulating film, and being connected to the plurality of light-emitting-layer forming portions via the respective openings; and
an upper electrode provided selectively on the transparent electrode so as to connect portions above and corresponding to the respective openings to one another, and joining portions to one another on the portions, the portions corresponding respectively to the openings,
wherein a portion of the transparent electrode in the opening is provided between the lower electrode and the upper electrode.

7. The semiconductor light emitting device according to claim 6 wherein the insulating film function as an antireflection film against light emitted from the light-emitting-layer forming portions.

8. The semiconductor light emitting device according to claim 7 wherein the thickness of the insulating film is $m \cdot \lambda / (4n_r)$ where $\lambda$ represents the wavelength of light emitted from the light-emitting-layer forming portions, $n_r$ represents the refractive index of the insulating film, and m represents any positive odd number.

9. The semiconductor light emitting device according to claim 6 further comprising a transparent resin provided between the insulating film and the transparent electrode among the plurality of light-emitting-layer forming portions.

10. The semiconductor light emitting device according to claim 9 wherein the upper surface of the transparent resin is on the same plane as the upper surface of the insulating film.

11. The semiconductor light emitting device according to claim 9 further comprising:
a first lead electrically connected to the lower electrode;
a second lead electrically connected to the upper electrode; and
a second transparent resin sealing the lower electrode, the conductive substrate, the metal film, the plurality of light-emitting-layer forming portions, the insulating film, the transparent electrode, the upper electrode; the transparent resin, the first lead, and the second lead.

12. The semiconductor light emitting element according to claim 6 further comprising, in each light-emitting-layer forming portion, a light-guiding layer inserted into at least one of the interface between an n-type cladding layer and an active layer, and the interface between the active layer and a p-type cladding layer,
wherein the light-guiding layer has a refractive index equivalent to a mean value of the refractive indices of the respective layers in contact with the light-guiding layer on the two sides thereof.

13. The semiconductor light emitting element according to claim 6 wherein, as to each light-emitting-layer forming portion, the side surface is perpendicular to, and otherwise is slightly inclined rather than perpendicular to, the upper surface.

14. The semiconductor light emitting element according to claim 6 wherein each light-emitting-layer forming portion is made of a compound semiconductor composed of: at least one of elements consisting of In, Ga and Al; and at least one of elements consisting of P and N.

15. The semiconductor light emitting element according to claim 6 wherein the metal film is made of at least one of gold, and an alloy including gold.

16. The semiconductor light emitting element according to claim 6 wherein an ohmic contact portion of the metal film has a patterned portion made of Au having one of Ge and Zn added thereto.

17. The semiconductor light emitting element according to claim 6 wherein the conductive substrate is a silicon substrate.

18. The semiconductor light emitting element according to claim 6 wherein the upper electrode is a bonding pad.

19. The semiconductor light emitting element according to claim 12 wherein the active layer has a MQW structure including not more than 10 well layers.

20. The semiconductor light emitting element according to claim 6 wherein the transparent electrode is made of indium tin oxide connected to the second surface of each light-emitting layer forming portion via an opening formed in the corresponding one of the insulating films.

* * * * *